United States Patent [19]
D'Addeo

[11] Patent Number: 5,532,509
[45] Date of Patent: Jul. 2, 1996

[54] SEMICONDUCTOR INVERTER LAYOUT HAVING IMPROVED ELECTROMIGRATION CHARACTERISTICS IN THE OUTPUT NODE

[75] Inventor: Michael L. D'Addeo, Austin, Tex.

[73] Assignee: Motorola, Inc., Schumburg, Ill.

[21] Appl. No.: 357,469

[22] Filed: Dec. 16, 1994

[51] Int. Cl.⁶ .................................................. H01L 29/06
[52] U.S. Cl. .......................... 257/618; 257/767; 257/773; 257/909; 257/919; 257/923; 257/369
[58] Field of Search ..................................... 257/618, 767, 257/773, 909, 919, 923, 369

[56] References Cited

U.S. PATENT DOCUMENTS 5,365,110  11/1994  Matsuoka ................................ 257/762

*Primary Examiner*—Edward Wojciechowicz
*Attorney, Agent, or Firm*—Minh-Hien Clark

[57] ABSTRACT

A particular layout (38) of transistors along a continuous conductor line (54), such as the transistors in a CMOS inverter, has been found which reduces breaks or voids in the conductor line due to electromigration of the conductor atoms from predominantly unidirectional current flows. The conductor line may be a metal line. By alternating the two types of transistors, p- and n-type (40, 41, 46 & 47), along the length of the metal line, almost the entire length of the line can be changed to one with bidirectional current flow which significantly reduces the mean-time-to-failure for electromigration-related damage. The layout arrangement will find greater advantage for large transistors, long metal lines, relatively large unidirectional current flows and devices that run at high frequency, such as clock drivers.

15 Claims, 2 Drawing Sheets

SEMICONDUCTOR INVERTER LAYOUT HAVING IMPROVED ELECTROMIGRATION CHARACTERISTICS IN THE OUTPUT NODE

FIELD OF THE INVENTION

The present invention relates generally to a layout for a semiconductor device, and more specifically to a CMOS inverter layout having reduced unidirectional current in the output node.

BACKGROUND OF THE INVENTION

FIG. 1 illustrates a conventional way to lay out a complementary metal oxide semiconductor (CMOS) inverter 10 on a silicon wafer, where the specific embodiment shown has a p-type transistor 12 in n-well and an n-type transistor 14 in p-doped region to give a p to n aspect ratio of 2 to 1, and where the p to n aspect ratio is split into two legs. Each p-type transistor 12 has output contacts 16 over drain 17, where the output contacts 16 serve as a terminal for both legs of transistors 12 arranged in mirror-image relationship on either side of a continuous first level interconnect or output line 20. Each n-type transistor 14 has output contacts 18 over drain 19, where output contacts 18 serve as a terminal for both legs of transistors 14, also in mirror-image relationship. A continuous first level interconnect or output line 20 connects the output contacts 16 and 18, and may be metal, such as aluminum. It is in this line 20 where electromigration problems occur.

To complete this description, the input to the inverter is along input lines 30 which function as the gates in the inverter 10, and which may be doped polysilicon. The sources 32 for p-type transistors 12 are power supply, $V_{DD}$, and the sources 34 for n-type transistors 14 are ground.

With this conventional layout, unidirectional currents are present in the output node in the vicinity of the inverter. In FIG. 1, the arrows indicate the direction of current flow. When the input lines 30 are low, there is unidirectional current in the entire continuous first level interconnect or output line 20 over the p-transistor 12. When the input lines 30 are high, there is unidirectional current in the entire continuous first level interconnect or output line 20 over the n-transistor 14, as shown in FIG. 1. With this conventional layout 10, only the horizontally oriented portion of the metal output line 20 is bidirectional. For the rest of the length, oriented vertically in FIG. 1, metal output line 20 is unidirectional. That is, in the upper two-thirds over p-transistor 12 and drain 17, current only flows down output line 20 (as oriented in FIG. 1), never up; in the lower one-third over n-transistor 14 and drain 19, current also only flows down output line 20, never up. Because of the cumulative and repeated unidirectional flows of electrons in this latter portion of metal output line 20, there is repeated electromigration of the metal atoms in the direction of current flow and thus potential breakage points in the metal lines at regions 36.

S. M. Sze, ed., VLSI Technology, McGraw-Hill, New York, 1983, pp. 369–371, indicates that "[a] prime consideration in device reliability is the electromigration resistance of the metallization. Electromigration is observed as a material transport of the conductive material. It occurs by the transfer of momentum from the electrons, moving under the influence of the electric field applied along the conductor, to the positive metal ions. Hence, after a conductor failure, a void or break in the conductor is observed and a nearby hillock or other evidence of material accumulation in the direction of the anode [Figure references omitted.] is found."

On page 370, Sze shows several SEM micrographs of breaks in metal lines. Techniques to increase electromigration resistance of aluminum film conductors include alloying with copper, incorporation of discrete layers such as titanium, encapsulating the conductor in a dielectric or incorporating oxygen during film deposition. The mean-time-to-failure (MTF) of the conductor also seems to be related to the grain size in the metal film; distribution of grain size; the degree to which the conductor exhibits fiber texture, i.e. in the <111> direction; method of film deposition and line width, according to Sze.

It would be helpful if other straightforward methods were discovered which reduce electromigration and increase MTF for metal and other conductors.

BRIEF DESCRIPTION OF THE DRAWINGS

The present invention is illustrated by way of example and not limitation in the figures of the accompanying drawing, in which like references indicate similar elements, and in which.

DETAILED DESCRIPTION OF A PREFERRED EMBODIMENT

There is provided, in one form, a layout for a semiconductor device having at least two first-type transistors (e.g. p-type transistors), each having a first output terminal and a second-type transistor (e.g. at least one n-type transistor) having a second output terminal. There is also present a continuous conductor line serially connecting the first and second output terminals. The second-type transistor is disposed between the at least two first-type transistors along the continuous conductor line for reducing electromigration along the conductor line by reducing a proportion of the conductor line having only unidirectional current.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

Figure 1:
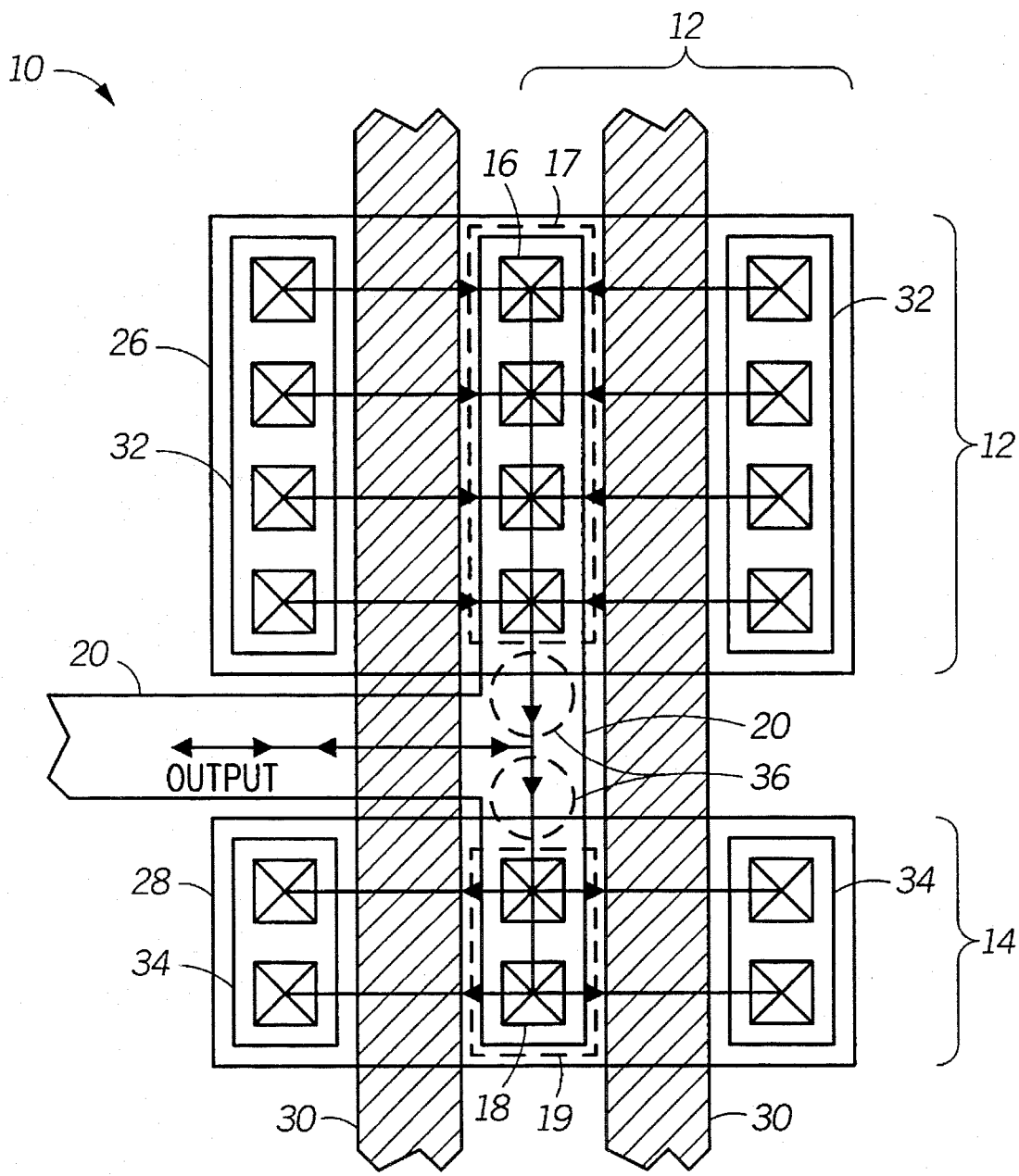
FIG. 1 illustrates a plan layout of a prior art CMOS inverter.
Figure 2:
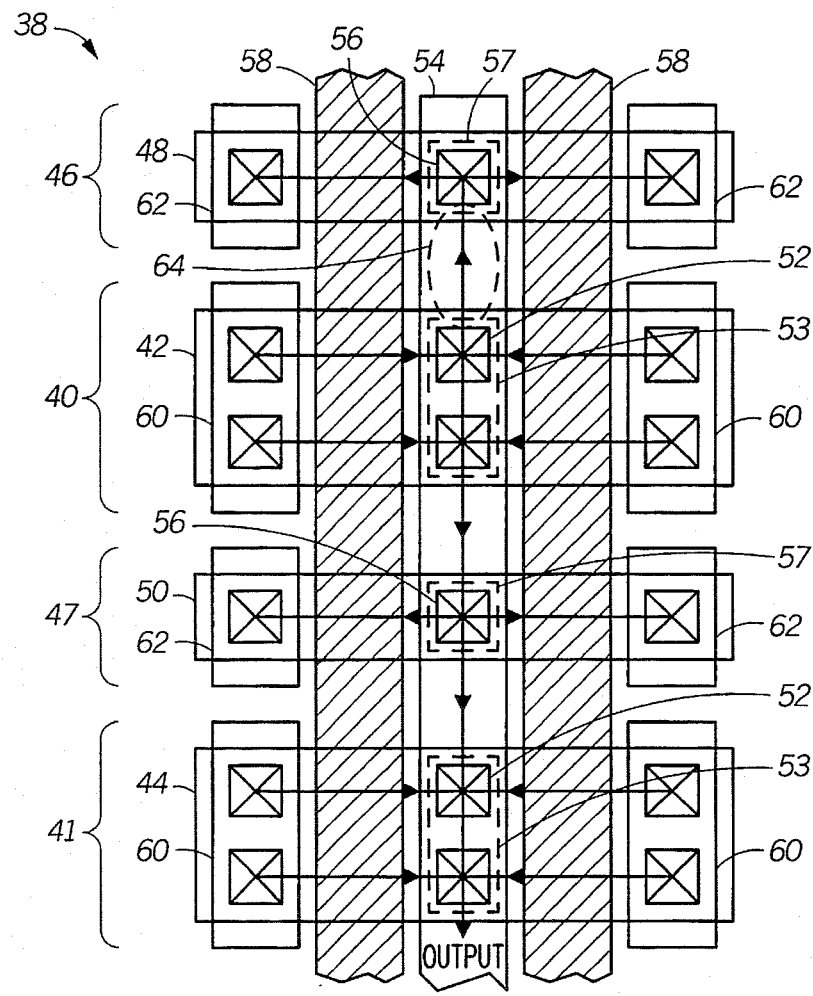
FIG. 2 illustrates a plan layout of a CMOS inverter according to this invention.

It has been discovered that by breaking up the p- and n-regions of an inverter, e.g., and distributing them along the output node one can create an output node that carries bidirectional current along almost its entire length and thus significantly reduce the problem of electromigration. As shown in FIG. 2, there are present two p-type transistors 40 and 41 in overall CMOS inverter 38, p-type transistor 40 split into two legs and p-type transistor 41 also split into two legs. There are also present two n-type transistors 46 and 47, where n-type transistor 46 is split into two legs and n-type transistor 47 is also split into two legs. The p-type transistors 40 and 41 and n-type transistors 46 and 47 are disposed between each other in alternating or interdigitated fashion; the purpose for which will become clear. Each p-type transistor 40 has output contacts 52 over drains 53, where output contacts 52 serve as a terminal for both legs of transistors 40 oriented on either side of central continuous first level interconnect or conductor output line 54 in mirror image fashion. Similarly, each n-type transistor 46 and 47 has output terminals 56 over drain 57, where output contacts 56 in the particular FIG. 2 embodiment serve as a terminal for both legs of n-type transistors 46 and 47 oriented on either side of the central continuous first level interconnect or output line 54. The central continuous first level interconnect or output line 54 serially connects all output contacts 52 and 56.

While both p-type transistors 40 and 41 may be conceptually thought of as one large p-type transistor electrically, they are now physically separated from one another into two different n-wells, first and second n-wells 42 and 44, respectively. Similarly, while both n-type transistors 46 and 47 may be conceptually thought of as one large n-type transistor electrically, they are now physically separated from one another into two different p-doped regions, first and second p-doped regions 48 and 50, respectively. To complete the description, the input to the inverter is along input lines 58 which function as the gates in the inverter 38, and may be doped polysilicon or other conductor. The sources 60 for p-type transistors 40 and 41 are $V_{DD}$ and the sources 62 for n-type transistors 46 and 47 are ground.

With the layout of the invention, the central continuous first level interconnect or output line 54 carries bidirectional current everywhere except the short far segment 64 thereof. However, the amount of current flowing through segment 64 is only a small fraction of the total current, so that electromigration is further reduced in this limited unidirectional portion. Further, the healing effect of bidirectional electromigration is present along nearly the entire length of continuous first level interconnect or output line 54. The healing effect involves electromigration of the positive metal ions in the opposite direction from which the current normally comes. The metal atoms are pushed back in the other, opposite direction by the momentum of the electrons thus reversing the displacement of the metal atoms and relocating them such that the net electromigration is reduced. Thus, any metal atom dislocations in one direction are "healed" by current flow in the other direction. It will be appreciated that for the healing effect to work best, the current in the metal line is completely bidirectional, i.e. in one direction half of the time and in the opposite direction the other half of the time with equal current load in both directions. Thus, since segment 64 carries relatively small currents, the chances for electromigration-caused conductor failure are unlikely.

Because of these reasons, the particular multiple device layout of this invention will have a greater effect on circuits with many devices along a continuous metal line where the current is completely or predominantly in one direction along a relatively long length of the metal line, as in a CMOS inverter. If the two types of transistors, p-type and n-type transistors are arranged to alternate in some way, as shown in FIG. 2, then much more of the metal line becomes bidirectional.

Figure 3:
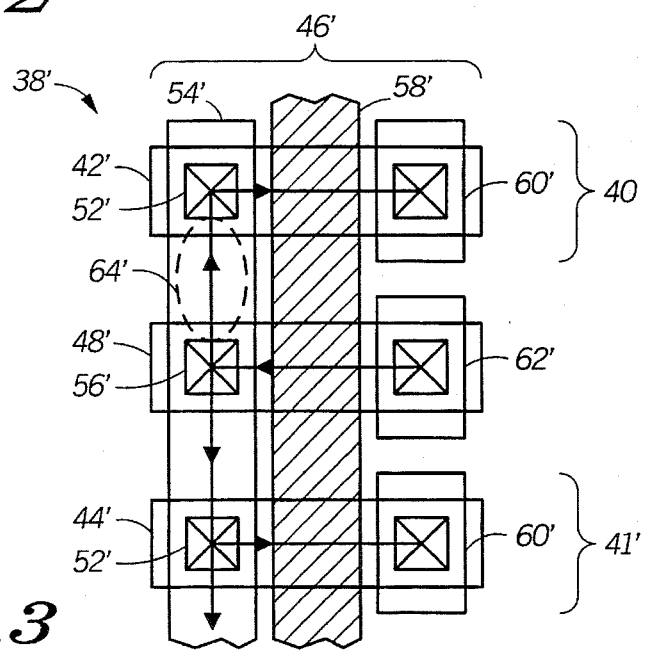
FIG. 3 illustrates a plan layout of another, alternate CMOS inverter in accordance with this invention.

It will be appreciated that the invention is not limited to the exact configuration shown in FIG. 2, for example p-type transistors 40 and 41 may be differently arranged, but still arranged alternately or in interdigitated fashion with the n-type transistors 46 and 47. Shown in FIG. 3 is a smaller layout exemplifying the invention of two p-type transistors 40' and 41', having an n-type transistor 46' in p-doped region 48' between them. All of the reference numerals of FIG. 2 apply to like elements in the FIG. 3 layout except for the use of a prime (') designation to distinguish them. The p-type transistors 40' and 41' and n-transistor 46' are not split into two mirror-image legs, as the inverter 38 of FIG. 2. As noted, of course, the invention will find greater advantage as the size of the inverter, i.e. as the physical size of the transistors increases, and for long conductor lines (particularly metal lines) and relatively large unidirectional current flows at higher frequencies.

It is appreciated that a drawback to the layout of the invention is that it requires somewhat more area than the traditional design for the same circuit. However, as geometry sizes continue to decrease and as frequencies increase, the reliability improvement with the inventive layout will justify the extra area, at least for large inverters that switch at clock frequency. It is also expected that in the future the distance between p and n diffusion regions can be significantly decreased, thereby reducing the area cost of the inventive layout.

The foregoing description and illustrations contained herein demonstrate many of the advantages associated with the present invention. In particular, it has been revealed that electromigration-related failures due to voids and breaks may be greatly reduced by distributing the two types of transistors over a continuous metal line in an alternating fashion. Moreover, the advantages of the invention increase with larger devices, higher frequency and relatively high currents.

Thus it is apparent that there has been provided, in accordance with the invention, a layout for semiconductor devices that meets the need and advantages set forth previously. Although the invention has been described and illustrated with reference to specific embodiments thereof, it is not intended that the invention be limited to these illustrative embodiments.

Those skilled in the art will recognize that modifications and variations can be made without departing from the spirit of the invention. For example, the invention is not limited to any particular size of devices. In addition, the invention is not limited to alternating the two types of devices in any particular way. For example, the two types of transistors may be alternated in an n-p-n-p pattern split into two legs as in FIG. 2 or a p-n-p pattern shown in FIG. 3 which is not split. The pattern may be p-n-p-n-p-n, for example, and within the scope of this invention. The invention is not limited to whether or not the transistors are split into mirror-image legs or not, or to the type or number of contacts made to the source and drain regions. What is important is that the bidirectional portion of the continuous metal line is significantly increased to thereby reduce the danger of electromigration. Therefore, it is intended that this invention encompass all such variations and modifications falling within the scope of the appended claims.

I claim:

1. A layout for a semiconductor device comprising:

at least two first-type transistors, each having a first output terminal;

a second-type transistor having a second output terminal, wherein the at least two first-type transistor and the second-type transistor are connected to an input line voltage; and a continuous conductor line, having an output end, serially connecting the first and second output terminals;

wherein the second output terminal of the second-type transistor is disposed between the first output terminals of the at least two first-type transistor along the continuous conductor line to separate the first output terminals which enables a bidirectional current flow along a major portion of the continuous conductor line because when the input line voltage is at a first level, current flows in a first direction toward the output end, and when the input line voltage is at a second level, currently flows in an opposing second direction away from the output end, which reduces electromigration along the continuous conductor line by reducing a proportion of the continuous conductor line having only unidirectional current.

2. The layout of claim 1, wherein the layout is characterized as a CMOS inverter.

3. The layout of claim 1, wherein the at least two first-type transistors are further characterized as p-type transistors and the second-type transistor is further characterized as an n-type transistor.

4. The layout of claim 1, wherein the at least two first-type transistors are further characterized as n-type transistors and the second-type transistor is further characterized as a p-type transistor.

5. The layout of claim 1, wherein the at least two first-type transistors, each having a first gate connected together, and the second-type transistor having a second gate, wherein the first and second gates are connected such that the at least two first-type transistors operate as a single transistor.

6. The layout of claim 1, wherein the continuous conductor line is a metal line.

7. A layout for a semiconductor device comprising:

at least two first-type transistors, each having a first drain terminal, wherein each of the at least two first-type transistors is laid out in physically separate gate and source regions but sharing the first drain terminal;

a second-type transistor having a second drain terminal, wherein the second-type transistor is laid out in physically separate gate and source regions but sharing the second drain terminal, wherein the at least two-first type transistors and the second-type transistor are connected to and input line voltage; and a continuous conductor line, having and output end, serially connecting the first and second drain terminals;

wherein the second drain terminal of the second-type transistor is disposed between the first drain terminals of the at least two first-type transistors along the continuous conductor line to a separate the first drain terminals which enables a bidirectional current flow along a major portion of the continuous conductor line because when the input line voltage is a first level, current flows in a first direction from one of either the second-type transistor or the least two first-type transistor toward the output end, and when the input line voltage is at a second level, current flows in an opposing second direction away from the output end toward one of either the second-type transistor or the at least two first-type transistors which reduces electromigration along the continuous conductor line by reducing a proportion of the conductor line having only unidirectional current.

8. The layout of claim 7, wherein the at least two first-type transistors are further characterized as p-type transistors and the second-type transistor is further characterized as an n-type transistor.

9. The layout of claim 7, wherein the at least two first-type transistors are further characterized as n-type transistors and the second-type transistor is further characterized as a p-type transistor.

10. The layout of claim 7, wherein the separate gate regions of the at least two first-type transistors and the second-type transistor are electrically interconnected, such that the at least two first-type transistors operate as a single transistor.

11. The layout of claim 7, wherein the continuous conductor line is a metal line.

12. A layout for a semiconductor device comprising:

a plurality of p-type transistors, each having a first drain terminal, wherein each of the plurality of p-type transistors is laid out in physically separate and parallel gate and source regions but sharing the first drain terminal;

a plurality of n-type transistors, each having a second drain terminal, wherein each of the plurality of n-type transistors is laid out in physically separate and parallel gate and source regions but sharing the second drain terminal, wherein the plurality of p-type transistors and the plurality of n-type transistors are connected to an input line voltage; and a continuous metal line, having an output end, serially connecting the first and second terminals;

wherein the first and second drain terminals of the pluralities of p-type and n-type transistors, respectively, are divided and alternately distributed along the continuous metal line which enables a bidirection current flow along a major portion of the continuous metal line because when the input line voltage is at a first level, current flows in a first direction from the plurality of p-type transistors toward the output end and when the input line voltage is at a second level, current flows in a second opposing direction from the output end toward the plurality of n-type transistors, which reduces electromigration along the metal line by reducing a proportion metal line having only unidirectional current.

13. The layout of claim 12, wherein the pluralities of n-type and p-type transistors are further characterized as MOS transistors.

14. The layout of claim 13, wherein the layout is characterized as a CMOS inverter.

15. The layout of claim 12, wherein the gate regions of the pluralities of p-type and n-type transistors are electrically interconnected, such that the plurality of p-type transistors operates as a single transistor and the plurality of n-type transistors operates as another single transistor.

* * * * *

UNITED STATES PATENT AND TRADEMARK OFFICE
CERTIFICATE OF CORRECTION

PATENT NO. : 5,532,509
DATED : July 2, 1996
INVENTOR(S) : Michael L. D'Addeo

It is certified that error appears in the above-indentified patent and that said Letters Patent is hereby corrected as shown below:

Column 4, line 58, change "transistor", to --transistors--.
Column 4, line 66, change "transistor", to --transistors--.
Column 5, line 6, change "currently", to --current--.
Column 5, line 38, change "and input", to --an input--.
Column 5, line 39, change "and", to --an--.
Column 5, line 44, change "a separate", to --separate--.
Column 5, line 47, change "a first", to --at a first--.
Column 5, line 49, change "the least two", to --the at least two--.
Column 5, lines 49/50, change "transistor", to --transistors--.
Column 6, line 31, after "second", add --drain--.
Column 6, line 36, change "bidirection", to --bidirectional--.

Signed and Sealed this

Twenty-third Day of September, 1997

Attest:

BRUCE LEHMAN

*Attesting Officer*  *Commissioner of Patents and Trademarks*